(12) United States Patent
Cosci et al.

(10) Patent No.: US 6,961,635 B2
(45) Date of Patent: *Nov. 1, 2005

(54) METHOD FOR YIELD IMPROVEMENT OF MANUFACTURED PRODUCTS

(75) Inventors: Michael Cosci, San Jose, CA (US); Paul Green, Hollister, CA (US); Garth Wade Helf, San Jose, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/802,962

(22) Filed: Mar. 16, 2004

(65) Prior Publication Data

US 2005/0209723 A1  Sep. 22, 2005

(51) Int. Cl.$^7$ ............................................. G06F 19/00
(52) U.S. Cl. ........................ 700/108; 700/115; 702/182
(58) Field of Search ....................... 700/114–117, 121, 700/100, 213, 223, 109–110, 175, 108, 115; 702/182–185

(56) References Cited

U.S. PATENT DOCUMENTS

| | | | |
|---|---|---|---|
| 5,231,585 A * | 7/1993 | Kobayashi et al. | 700/96 |
| 5,978,751 A | 11/1999 | Pence et al. | 702/179 |
| 6,118,632 A | 9/2000 | Albrecht et al. | 360/135 |
| 6,351,684 B1 * | 2/2002 | Shirley et al. | 700/121 |
| 2002/0040518 A1 | 4/2002 | Butts et al. | 29/603.09 |
| 2002/0060868 A1 | 5/2002 | Lenny et al. | 360/31 |
| 2002/0082846 A1 | 6/2002 | Chang et al. | 705/1 |
| 2002/0147518 A1 * | 10/2002 | Nguyen | 700/108 |

OTHER PUBLICATIONS

KPMG Casestudy, "Western Digital Rewrites Industry Standards for Quality with a Global Data Warehouse" web page.
Western Digital, "Data Lifeguard Online Diagnostics" web page.
Western Digital "What is Data Lifeguard" web page.
IEEE Transactions on Reliability, vol. 51, No. 3, Sep. 2002, "Improved Disk-Drive Failure Warnings" by Gordon F. Hughes, Joseph F. Murray, Kenneth Kreutz-Delgado and Charles Elkan.

* cited by examiner

*Primary Examiner*—Kidest Bahta
(74) *Attorney, Agent, or Firm*—Larry B. Guernsey; Intellectual Property Law Offices

(57) ABSTRACT

A method of yield improvement for manufactured products includes providing an identification plan for parts and processing equipment, whereby each part and each piece of equipment is given unique and traceable identification data. A database is provided into which the parts identification data and the processing equipment identification data are stored, and related. The parts are processed in at least one processing stage by the processing equipment to yield processed parts, and the processed parts are tested for defects. Problems are then identified through the testing of the processed parts. The related parts identification data and the processing equipment identification data are retrieved from the database, and the data is analyzed to trace the parts to the appropriate processing equipment. Corrections and repairs are made to the processing equipment to correct the problems. Improvement to yield of the manufactured products is then confirmed.

24 Claims, 6 Drawing Sheets

METHOD FOR YIELD IMPROVEMENT OF MANUFACTURED PRODUCTS

The present application is related to patent application entitled System for Yield Improvement of Manufactured Products, application Ser. No. 10/802,547, which is commonly assigned and filed co-temporaneously.

BACKGROUND OF THE INVENTION

1. Field of the Invention

The present invention relates to improvement of manufacturing yields and quality control testing procedures. More specifically, the present invention discloses a system and method for identifying and correcting defects in manufactured items which may be fabricated in several different locations, hard disk drives being one example of such a manufactured item.

2. Description of the Prior Art

Manufacturing is becoming an increasingly global activity. A product may be designed in one country and then the final product may be produced in one or more other countries around the world. Hard Disk Drives (HDD) are one example of this globalization of production, as the design of the product may take place in the United States, but the fabrication of the read-write heads may take place in a second country and the final assembly may take place in a third. Of course, product reliability is essential for any manufacturer that cares about keeping market share. Although the globalization of the manufacturing process may have advantages in terms of costs, it presents other challenges in terms of producing reliable items, and in identifying the source of defects or problems. To ensure the quality, then, of their products, manufacturers must have a comprehensive quality control system and methods.

As parts are made in one location and shipped to another for assembly, it is important that the parts and assemblies are traceable so that problems may be identified and corrected. This is a task that would have been overwhelming or impossible in the past, but fortunately the use of computers and databases is making this task more feasible.

Thus, there remains a need for a comprehensive method of identifying and correcting problems in a global manufacturing environment.

SUMMARY OF THE INVENTION

The present invention is a method of yield improvement for manufactured products, which includes providing an identification plan for parts, whereby each part is given unique and traceable identification data. An identification plan is provided for processing equipment by which each piece of equipment is given unique and traceable identification data. A database is provided into which the parts identification data and the processing equipment identification data are stored, and related. The parts are processed in at least one processing stage by the processing equipment to yield processed parts, and the processed parts are tested for defects and performance characteristics. Problems are then identified through this testing of the processed parts. The related parts identification data and the processing equipment identification data are retrieved from the database, and the data is analyzed to trace the parts to the appropriate processing equipment and to determine what corrections and repairs to the processing equipment may be necessary. Corrections and repairs are made to the processing equipment to correct the problems. Improvement to yield of the manufactured products is then confirmed.

It is an advantage of the present invention that it allows for easier analysis and correction of production problems in manufacturing facilities.

It is a further advantage of the present invention that it allows improvement of yields of manufactured products fabricated in facilities which may be widely dispersed geographically.

It is another advantage of the present invention that it allows for forward traceability of parts so that parts from a production device from which there are indications of problems may be traced downstream and monitored.

It is a further advantage of the present invention that it allows for backward traceability of parts so that parts from which there are indications of problems may be traced upstream to the machine which produced them and the machine inspected.

It is yet another advantage of the present invention that it allows for forward traceability of parts so that parts from a known batch produced by a known machine may be "sent ahead" of the main batch and monitored to give indications of expected performance of the main batch.

It is a further advantage of the present invention over previous methods of Failure Analysis (FA) in which the typical procedure is to choose a part at random and then perform FA on it to attempt to identify the source of the problem. This is a hit-and-miss operation which may work if all parts arrive from a single machine, whose operating parameters do not change much over the course of a run, but which may be less effective when examining parts from several machines or operations which are mixed together. In contrast, the present invention monitors specific parts and traces them to specific machines that produced them.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

In simple centralized manufacturing operations, where a few or perhaps even a single machine was responsible for turning out parts, tracing defects in these parts was a relatively simple process. As manufacturing and fabrication facilities become more diverse and far-spread, identifying and correcting defects becomes much more challenging, as a part may be made from plans in the United States, on a machine in Mexico, which then ships parts to Asia for final assembly. Or even more challenging, the same type of part may be made on machines in several different countries before then being shipped to several other different countries for final assembly, or perhaps just for an intermediate assembly before final assembly yet elsewhere. Traceability of parts becomes very important in these situations. This too becomes difficult when parts are made in great quantities and the parts themselves may be very small or otherwise hard to individually mark.

The present invention provides a system and method for improving yields of manufactured parts and thereby reducing costs of returning and repairing defective parts by identifying and correcting manufacturing defects. This system includes a methodology of yield improvement known by the acronym PAAR for Problem, Analysis, Action and Result. In broadest terms, PAAR stands for the following: 1) Problem identification, through customer communication and performance monitoring; 2) Analysis, to determine the source of the problem; 3) Action, efforts by manufacturing and engineering departments to solve the problem; and 4) Result, in which improvement to the yield is confirmed.

This method is possible, in a global manufacturing environment, by the improvements in component and fabrication machinery traceability that comes with modern data manipulation and storage capability. This can include computer database storage and the use of the internet for connectivity of devices.

Figure 1:
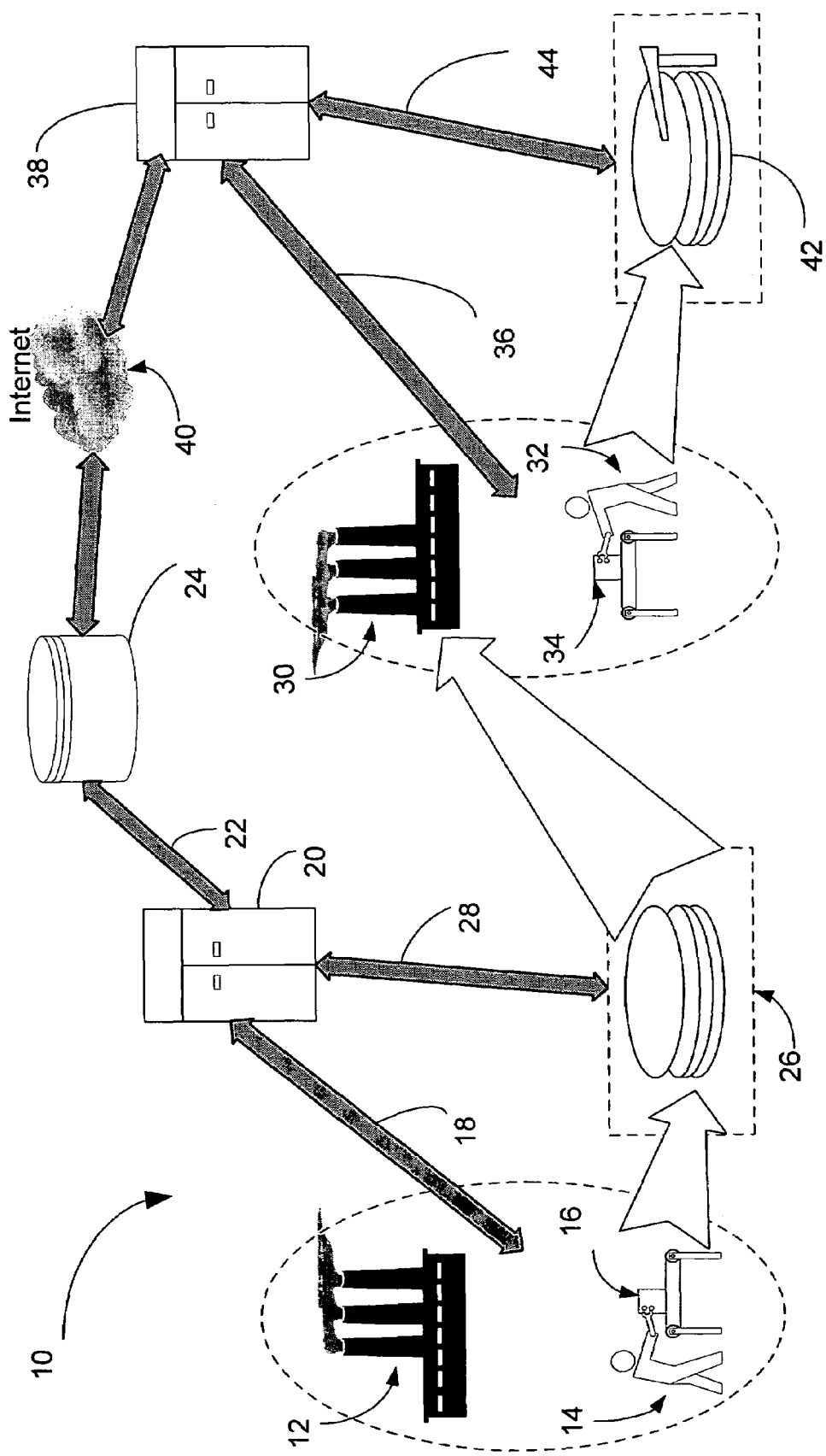
FIG. 1 is a block diagram of elements involved in the system of the present invention.

FIG. 1 shows a general model of the system 10 of the present invention. Generally, a first factory 12 has a manufacturing facility 14 which includes fabrication machinery 16, each of which is provided with identification data 18 which is entered into a computer terminal 20 having a data link 22 to a database 24. Manufactured parts 26 are provided with identification data 28, which is then also entered into the database 24 by way of the computer terminal 20, which may be the same, or a different computer which is connected to the database 24.

The manufactured parts 26 are then shipped to a second factory 30, although this may alternately be a second manufacturing facility 32 within the same factory 1. This second manufacturing facility 32 has a second set of fabrication machinery 34, which has been provided with identification data 36, which it will be assumed is entered into the database 24 by way of a second computer terminal 38 which is connected to the Internet 40. This of course could alternately be done by the second computer terminal having connection with the first by means of an intranet, or local area network, or possibly from a second computer terminal in the same facility if it is assumed that the second manufacturing operation takes place in the same factory 1.

The second manufacturing facility 32 performs its operation upon the manufactured parts to produced processed parts 42, which are then tested and performance data 44 is then entered into the database 24, again assumed by way of the second computer terminal 38 which is connected to the Internet 40.

This PAAR methodology has been successfully used to increase yields in the field of Hard Disk Drive (HDD) manufacture, and the following discussion will use the HDD field as an example, although it should be understood that this same system and method can be practiced in most manufacturing environments, so that the following discussion should not be thought of as being limited to the disk drive field.

Figure 2:
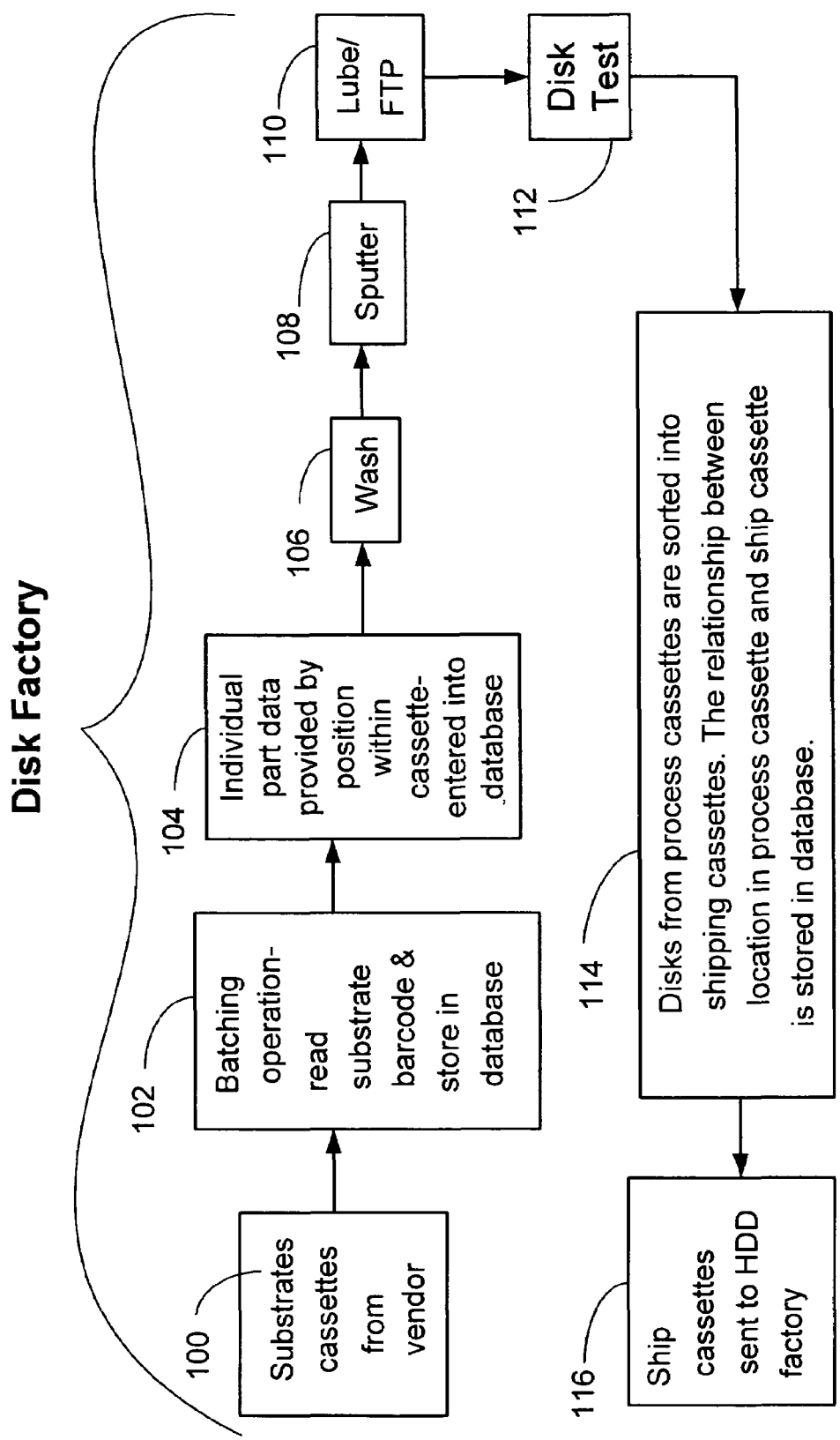
FIG. 2 is a first flow diagram of stages involved in the practice of the present invention as related to Hard Disk Drive manufacturing.
Figure 3:
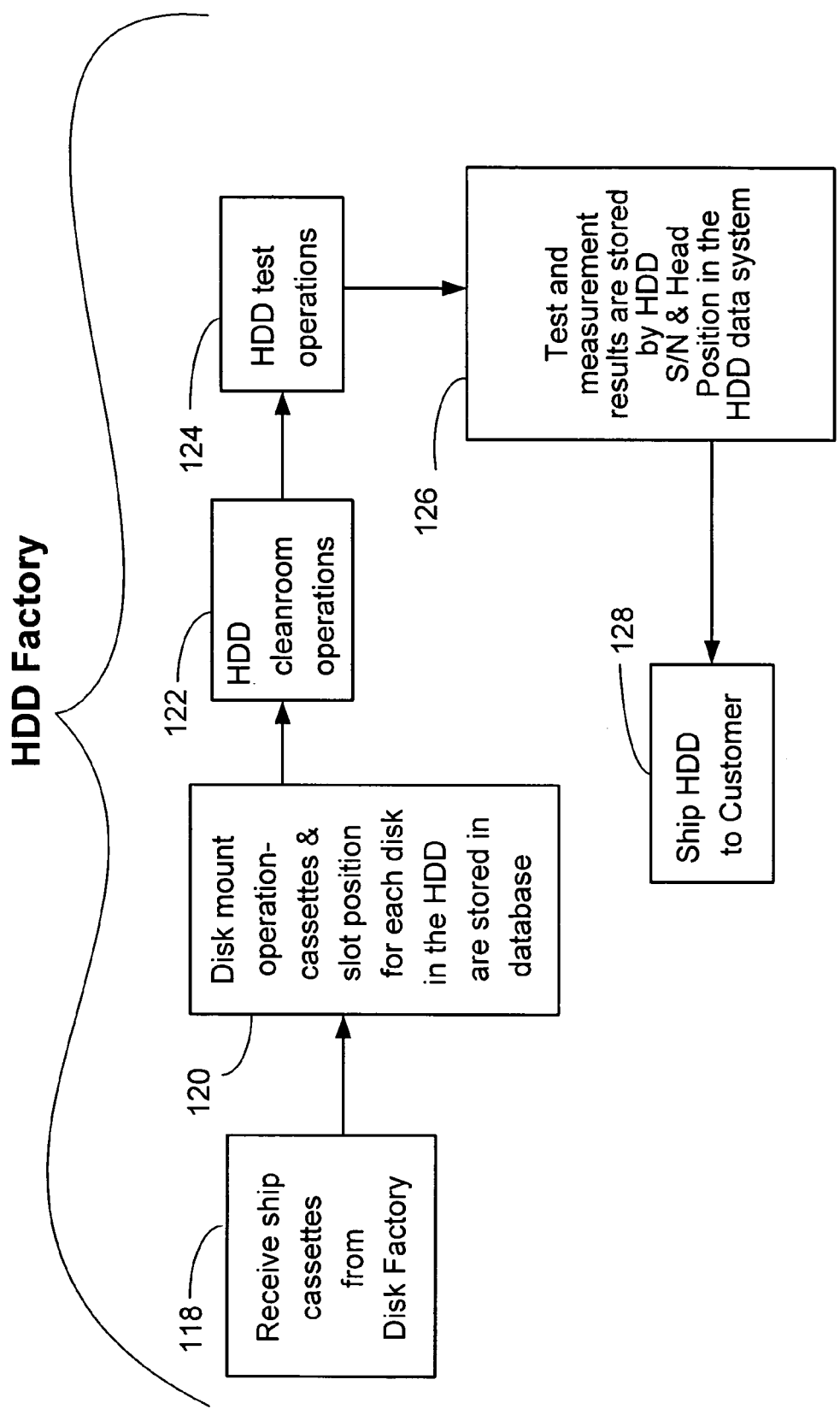
FIG. 3 is a second flow diagram of stages involved in the practice of the present invention as related to Hard Disk Drive manufacturing.

In this example, traceability is established by the system illustrated in FIGS. 2–3, which shows the stages that disks go through while in the disk manufacturing factory in FIG. 2 and then as they progress on through the HDD manufacturing factory and ultimately shipped to the customer in FIG. 3.

In FIG. 2, the disk substrates arrive in cassettes from a vendor 100 and all disks from one substrate cassette stay together in one process cassette. As part of the batching operation, a barcode has been assigned to each substrate and this barcode is read and stored in a database 102. Individual data for the disks 104 is provided by referencing separate positions within the cassette, and this data is part of the identification information which is entered into the database. The substrate disks are then sent through various individual processing steps, such as wash 106, sputter 108, lube 110 etc. Measurements may be taken during each of these processes so that, for example, the thickness of sputter layer is measured or the thickness of the lube recorded. If multiple machines are used for these processes, they too may be assigned identifiers which are stored in the database. Thus, later it may be determined which machine did, for example, the sputtering operation on a certain identified cassette of disks, in case it is later discovered that there is a defect in the sputtered layers, which may then be traced back to that specific machine and corrected.

Disks are tested in disk test operations 112 and if desired a Failure Analysis (FA) may be performed to correct problems which are encountered during the disk test, again by tracing parts back to the producing machine.

Disks from the process cassettes are then sorted into ship cassettes, and the relationship between location in the process cassette and the ship cassette is also stored in the database 114. The ship cassettes are then sent to the HDD Factory 116.

The process continues in FIG. 3, where the ship cassettes are received from the disk factory 118. Disk mount operation cassettes are produced, again with the relationship between location in the shipping cassette and the disk mount operation cassette being stored in the database. The disks are then identified by the slot position for each disk in the HDD and this data stored in the database 120 which may be a separate database, which is linked to the one the disk factory, or there may be a datalink to the first database. The disks are then processed by cleanroom operations 122, and HDD test operations 124. Test and measurement results are stored by HDD serial number and head position in the database 126. The HDD is then shipped to the customer 128. It is quite common for more data to be gathered from customer experiences and/or returned items which have failed in the field. This is not shown in the figures, but it operates in a similar manner to that discussed before, namely the PAAR operation is performed with the stages of Problem, Analysis, Action and Result, and used to increase the yield of the HDDs.

The present invention is an advance over previous methods of Failure Analysis (FA) in which the typical procedure is to choose a part at random and then perform FA on it to attempt to identify the source of the problem. This is a hit-and-miss operation which may work if all parts arrive from a single machine, whose operating parameters do not change much over the course of a run, but which may be less effective when examining parts from several machines or operations which are mixed together. In this case, random sampling can miss the problem entirely, or if found, the source of the problem may be difficult to pinpoint.

In contrast, the present invention allows both forward and backward traceability, so that for instance a measured defect or malfunction of one machine, when noted, can allow personnel to send advance notice to downstream operations to watch for certain defects or performance characteristics in the items produced by that malfunctioning machine. Or conversely, defects noted in a particular operation in a particular part or batch of parts can allow manufacturing engineers to inspect and possibly make repairs in equipment from earlier stages in the manufacturing process. It is also possible to send ahead a sample of a run of parts to see how it performs in later stages of assembly. For instance, a cassette of disks having marginal qualities during the polishing operations can have a sample piece sent ahead, build it into a HDD, and test the operational parameters through final testing, by which a judgment can be made as to whether the remainder of the cassette should be re-worked, or allowed to proceed for further processing.

Figure 4:
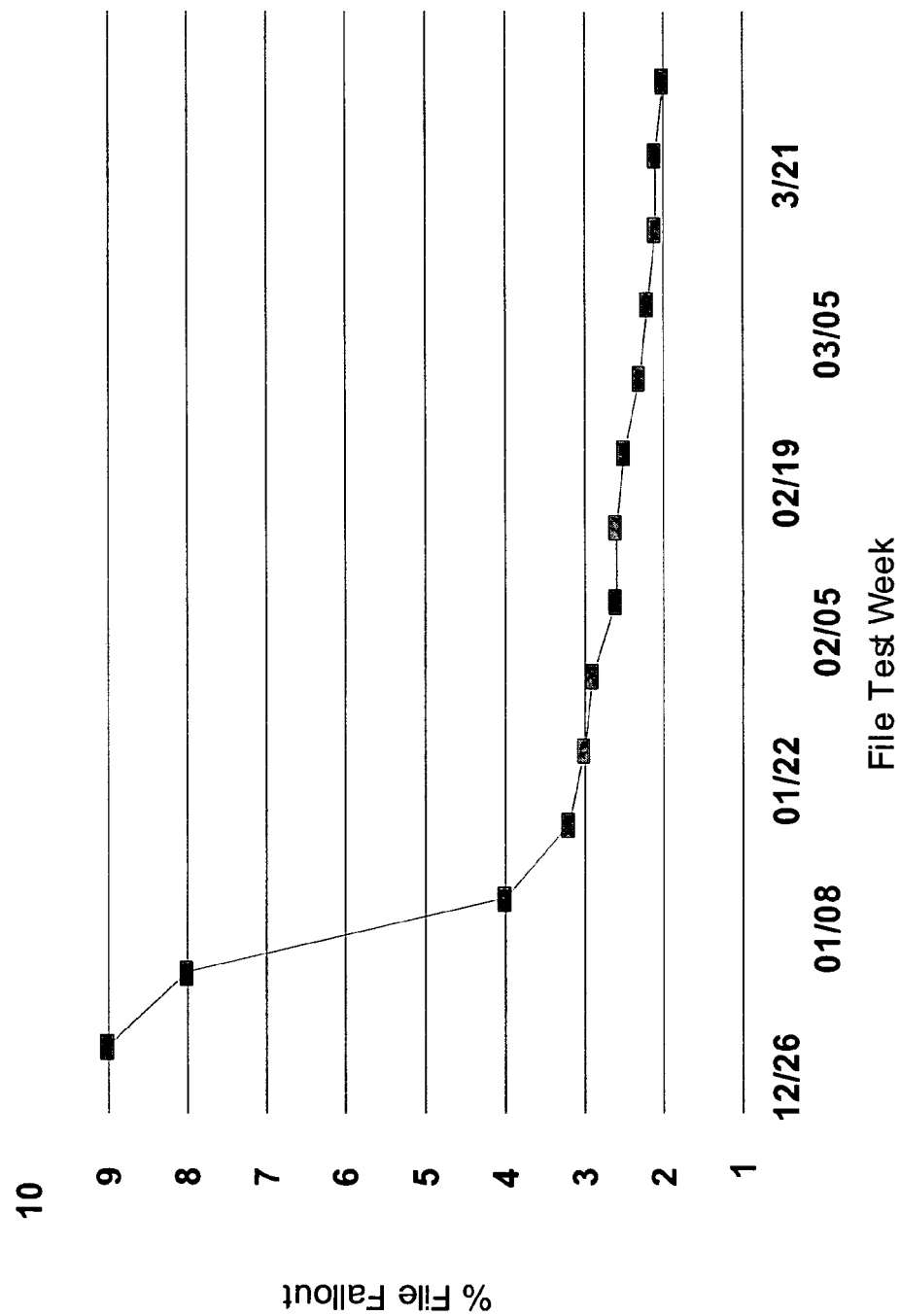
FIG. 4 is a first chart showing results of the practice of the present invention as related to Hard Disk Drive manufacturing.
Figure 5:
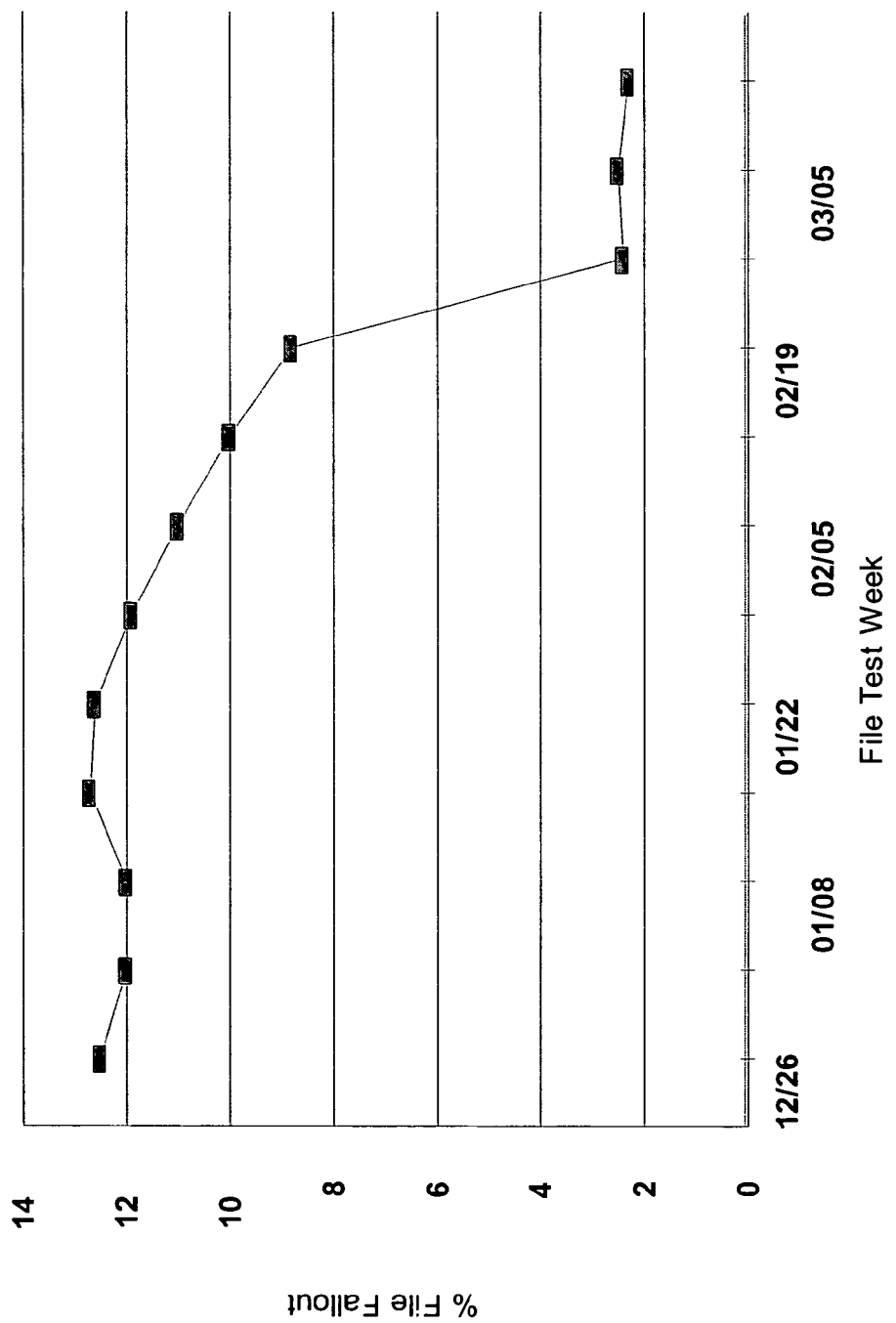
FIG. 5 is a second chart showing results of the practice of the present invention as related to Hard Disk Drive manufacturing.

FIGS. 4 and 5 show the improvement in yields of HDDs as the result of using the present invention. FIG. 4 shows the percentage of defects noted in HDDs as measured by the percentage of file reading defects detected during testing. Small disk defects were found, and analysis determined that small pre-sputter substrate defects were present. Action was taken to implement improved detection of these defects at an earlier stage, and the result can be seen as a reduction of file reading errors from 9% in the first week down to approximately 2% three months later.

FIG. 5 shows a similar graph of file reading defects which occur during a self-test cycle for HDDs. Analysis identified small defects in the disks, which were addressed by implementing enhanced prewash processes during the disk processing. The result is shown where the initial file fallout drops from over 12% to approximately 2% within three months. The effectiveness of the present invention is thus demonstrated in the improved yield of the products and decreased costs from loss of items to scrap.

Figure 6:
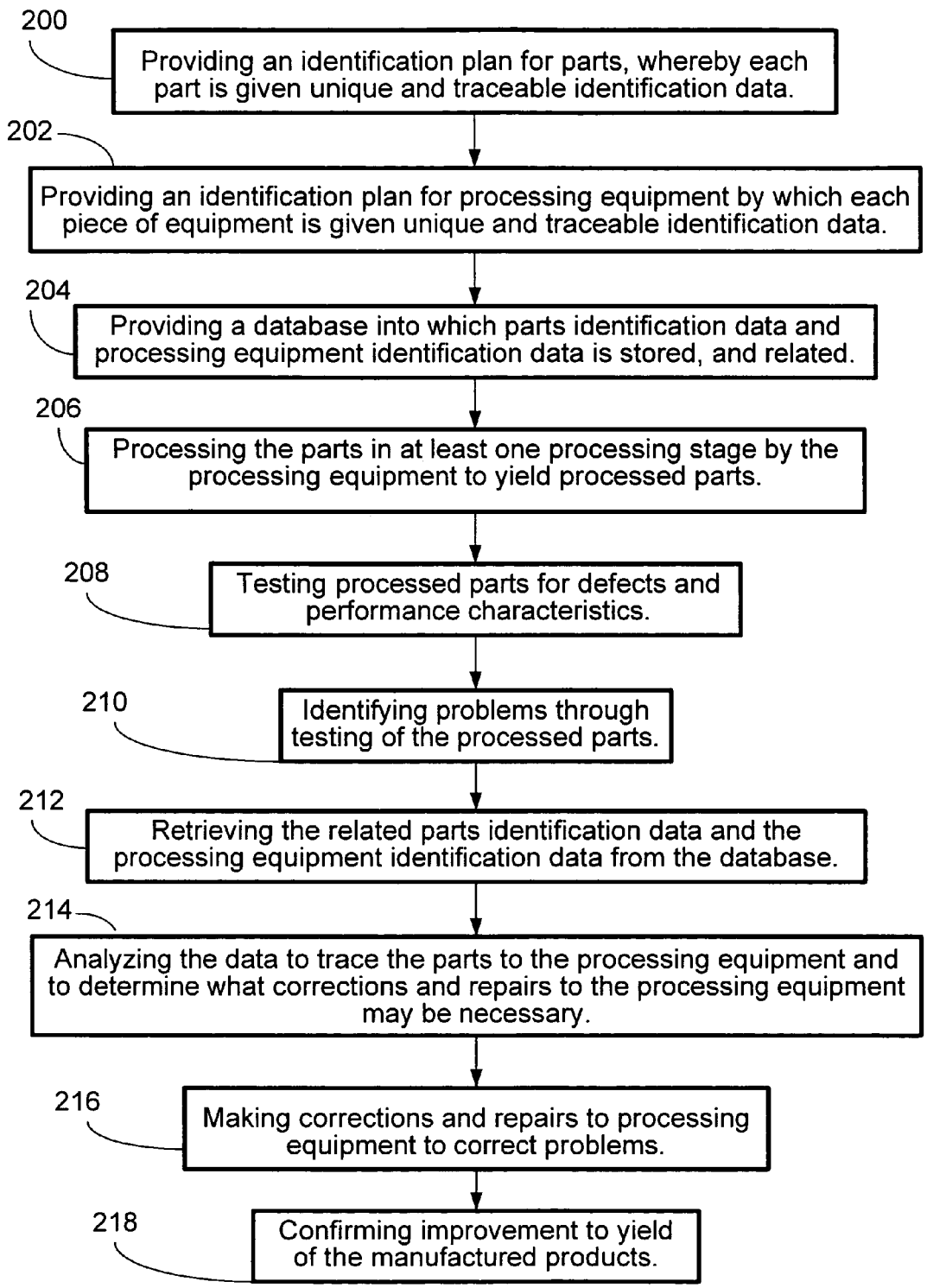
FIG. 6 is a general flow diagram of stages involved in the practice of the present invention as related to manufacturing products in general.

FIG. 6 shows a flowchart of the generalized major stages in the method of improving yields of manufactured products. These include: providing an identification plan for parts, whereby each part is given unique and traceable identification data 200;

Providing an identification plan for processing equipment by which each piece of equipment is given unique and traceable identification data 202;

Providing a database into which the parts identification data and the processing equipment identification data are stored, and related 204;

Processing the parts in at least one processing stage by the processing equipment to yield processed parts 206;

Testing the processed parts for defects and performance characteristics 208;

Identifying problems through the testing of the processed parts 210;

Retrieving the related parts identification data and the processing equipment identification data from the database 212;

Analyzing the data to trace the parts to the processing equipment and to determine what corrections and repairs to the processing equipment may be necessary 214;

Making corrections and repairs to processing equipment to correct the problems 216; and Confirming improvement to yield of the manufactured products 218.

Placing these steps in the context of the PAAR operation discussed above, stages 210, 214, 216 and 218 respectively correspond to the stages of Problem, Analysis, Action and Result.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What is claimed is:

1. A method of yield improvement for manufactured products, comprising:
   A) providing an identification plan for parts, whereby each part is given unique and traceable identification data by assigning numbers to batches of parts and further assigning data related to positions within said batch of parts;
   B) providing an identification plan for processing equipment by which each piece of equipment is given unique and traceable identification data;
   C) providing a database into which said parts identification data and said processing equipment identification data are stored, and related;
   D) processing said parts in at least one processing stage by said processing equipment to yield processed parts;
   E) testing said processed parts for defects and performance characteristics;
   F) identifying problems through said testing of said processed parts;
   G) retrieving said related parts identification data and said processing equipment identification data from said database;
   H) analyzing said data to trace said parts to said processing equipment and to determine what corrections and repairs to said processing equipment may be necessary;
   I) making corrections and repairs to processing equipment to correct said problems; and
   J) confirming improvement to yield of said manufactured products.

2. The method of claim 1, wherein:
said database of C is accessible from multiple computer terminals.

3. The method of claim 2, wherein:
said multiple computer terminals are located in separate facilities.

4. The method of claim 3, wherein:
said multiple computer terminals are connected by the Internet.

5. The method of claim 3, wherein:
said multiple computer terminals are connected by an intranet.

6. The method of claim 1, wherein:
said processing equipment of B is located in more than one manufacturing facility.

7. The method of claim 1, wherein:
said testing of said processed parts of E is done in a separate manufacturing facility from the one in which at least one of said at least one processing stage is performed.

8. The method of claim 1, wherein:
said testing of said processed parts of E includes shipping finished manufactured products to consumers and monitoring field problems.

9. The method of claim 1, wherein:
said identifying problems of said processed parts of F includes shipping finished manufactured products to consumers, monitoring field problems and inspecting returned products.

10. The method of claim 1, wherein:
said identifying of problems of said processed parts of F includes tracing parts downstream to monitor performance of parts from a processing machine which is suspected of having problems.

11. The method of claim 1, wherein:
said identifying of problems of said processed parts of F includes tracing parts upstream to correct performance of a processing machine which is suspected of causing problems.

12. The method of claim 1, wherein:
said identifying of problems of F includes sending ahead parts from a main batch to test performance of the main batch.

13. A method of yield improvement for HDDs, comprising:
A) providing an identification plan for parts, whereby each part is given unique and traceable identification data by assigning numbers to disk batches and further assigning position data related to positions within said disk batches;
B) providing an identification plan for processing equipment by which each piece of equipment is given unique and traceable identification data;
C) providing a database into which said parts identification data and said processing equipment identification data are stored, and related;
D) receiving disk cassettes;
E) inputting disk identification data from disk batches and position data into said database;
F) processing said disks in at least one processing stage by said processing equipment to produce HDDs;
G) testing said HDDs for defects and performance characteristics;
H) identifying problems through said testing of said HDDs;
I) retrieving said related disk identification data and said processing equipment identification data from said database;
J) analyzing said data to trace said HDDs to said processing equipment to determine what corrections and repairs to said processing equipment may be necessary;
K) making corrections and repairs to processing equipment to correct said problems; and
L) confirming improvement to yield of said HDDs.

14. The method of claim 13, wherein:
said database of C is accessible from multiple computer terminals.

15. The method of claim 14, wherein:
said multiple computer terminals are located in separate facilities.

16. The method of claim 15, wherein:
said multiple computer terminals are connected by the Internet.

17. The method of claim 15, wherein:
said multiple computer terminals are connected by an intranet.

18. The method of claim 13, wherein:
said processing equipment is located in more than one manufacturing facility.

19. The method of claim 13, wherein:
said testing of said HDDs of G is done in a separate manufacturing facility from the one in which at least one of said at least one processing stage is performed.

20. The method of claim 13, wherein:
said testing of said HDDs of G includes shipping finished manufactured products to consumers and monitoring field problems.

21. The method of claim 13, wherein:
said identifying problems of said HDDs of H includes shipping finished manufactured products to consumers, monitoring field problems and inspecting returned products.

22. The method of claim 13, wherein:
said identifying of problems of said HDDs of H includes tracing parts downstream to monitor performance of parts from a processing machine which is suspected of having problems.

23. The method of claim 13, wherein:
said identifying of problems of said HDDs of H includes tracing parts upstream to correct performance of a processing machine which is suspected of causing problems.

24. The method of claim 13, wherein:
said identifying of problems of said HDDs of H includes sending ahead parts from a main batch to test performance of the main batch.

* * * * *